United States Patent
Hur et al.

(10) Patent No.: US 10,277,173 B1
(45) Date of Patent: Apr. 30, 2019

(54) AMPLIFIER LINEARIZER WITH WIDE BANDWIDTH

(71) Applicant: QUALCOMM Incorporated, San Diego, CA (US)

(72) Inventors: Joonhoi Hur, San Diego, CA (US); Paul Draxler, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/816,511

(22) Filed: Nov. 17, 2017

(51) Int. Cl.
| H03F 1/30 | (2006.01) |
| H03F 1/42 | (2006.01) |
| H03F 1/02 | (2006.01) |
| H03F 3/195 | (2006.01) |
| H03F 3/213 | (2006.01) |

(52) U.S. Cl.
CPC ............ H03F 1/42 (2013.01); H03F 1/0205 (2013.01); H03F 3/195 (2013.01); H03F 3/213 (2013.01); H03F 2200/222 (2013.01); H03F 2200/387 (2013.01); H03F 2200/451 (2013.01); H03F 2200/75 (2013.01)

(58) Field of Classification Search
CPC ........ H03F 2200/522; H03F 1/30; H03F 3/20; H03G 3/30
USPC ................................................ 330/296, 285
See application file for complete search history.

(56) References Cited

U.S. PATENT DOCUMENTS

| 6,081,159 | A * | 6/2000 | Kim ...................... H03F 1/3205 330/149 |
| 6,353,360 | B1 | 3/2002 | Hau et al. |
| 6,791,418 | B2 * | 9/2004 | Luo ........................ H03F 1/0266 330/136 |
| 6,882,227 | B2 | 4/2005 | Barry et al. |
| 7,602,238 | B2 * | 10/2009 | Matsuzuka ........... H03F 1/0261 330/285 |
| 8,026,767 | B2 * | 9/2011 | Chen ...................... H03F 1/0266 330/285 |
| 8,089,313 | B2 * | 1/2012 | Chang ................... H03F 1/0266 330/136 |
| 8,115,552 | B2 * | 2/2012 | Kobayashi .............. H03F 1/302 330/281 |

(Continued)

FOREIGN PATENT DOCUMENTS

| EP | 2297847 A2 | 3/2011 |
| JP | H03104422 A | 5/1991 |
| KR | 20080023773 A | 3/2008 |

OTHER PUBLICATIONS

International Search Report and Written Opinion—PCT/US2018/056269—ISA/EPO—dated Jan. 23, 2019.

*Primary Examiner* — Henry Choe
(74) *Attorney, Agent, or Firm* — Patterson & Sheridan, L.L.P.

(57) ABSTRACT

Certain aspects of the present disclosure provide methods and apparatus for amplifying signals with an amplification circuit. The amplification circuit generally includes a first transistor, an input path coupled between an input node of the amplification circuit and a control input of the first transistor, and a feedforward path coupled between the input node and a feedforward node. In certain aspects, the amplification circuit may also include a first resistive device coupled between the feedforward node and the control input of the first transistor, a biasing circuit coupled to the feedforward node, and a low-impedance path coupled to the feedforward node.

16 Claims, 7 Drawing Sheets

(56) References Cited

U.S. PATENT DOCUMENTS

| | | | | |
|---|---|---|---|---|
| 8,680,921 | B2 * | 3/2014 | Honda | .................. H03G 3/3042 330/136 |
| 9,024,689 | B2 * | 5/2015 | Ding | ..................... H03F 1/0272 330/285 |
| 2012/0286873 | A1 | 11/2012 | Li et al. | |
| 2015/0162877 | A1 | 6/2015 | Ni et al. | |
| 2015/0171797 | A1 | 6/2015 | Ni et al. | |

* cited by examiner

US 10,277,173 B1

AMPLIFIER LINEARIZER WITH WIDE BANDWIDTH

TECHNICAL FIELD

Certain aspects of the present disclosure generally relate to electronic circuits and, more particularly, to an amplification circuit.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more power amplifiers (PAs) to amplify signals for transmission.

SUMMARY

Certain aspects of the present disclosure generally relate to improving the bandwidth and linearity of an amplification circuit.

Certain aspects of the present disclosure provide an amplification circuit. The amplification circuit generally includes a first transistor; an input path coupled between an input node of the amplification circuit and a control input of the first transistor; a feedforward path coupled between the input node and a feedforward node; a first resistive device coupled between the feedforward node and the control input of the first transistor; a biasing circuit coupled to the feedforward node; and a low-impedance path coupled to the feedforward node.

Certain aspects of the present disclosure provide a method for signal amplification. The method generally includes coupling an input signal to a feedforward node of a biasing circuit; coupling the input signal to a control input of a transistor, the feedforward node and the control input of the transistor being coupled through a resistive device; sinking at least a portion of the input signal coupled to the feedforward node via a low-impedance path; and amplifying the input signal coupled to the control input via the transistor.

Certain aspects of the present disclosure provide an apparatus for signal amplification. The apparatus generally includes means for coupling an input signal to a feedforward node of a biasing circuit; means for coupling the input signal to an amplification node; means for amplifying the input signal coupled to the amplification node; and means for sinking at least a portion of the input signal coupled to the feedforward node, the means for sinking having a low-impedance.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
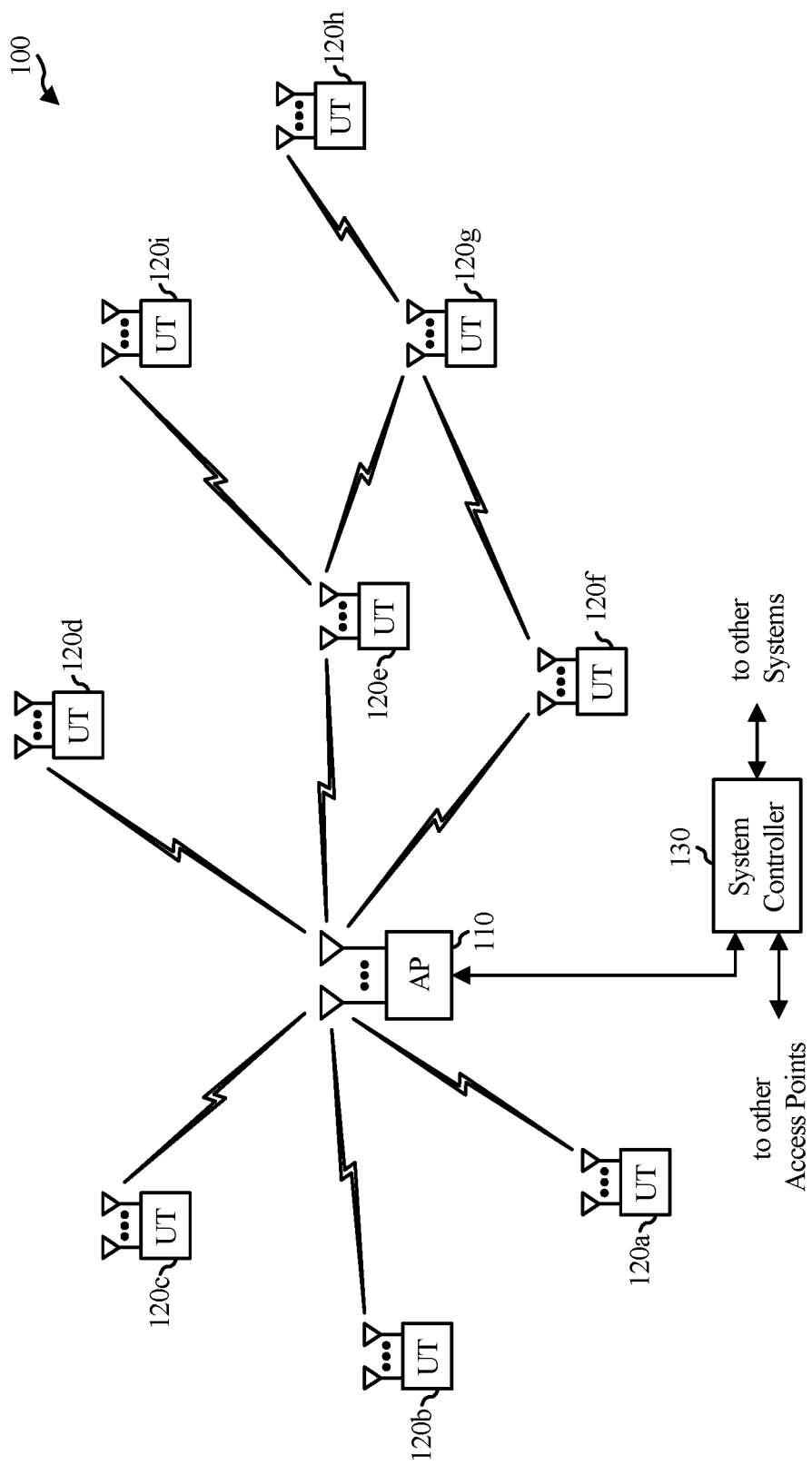
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include at least one power amplifier (PA), as described in more detail herein.

Figure 2:
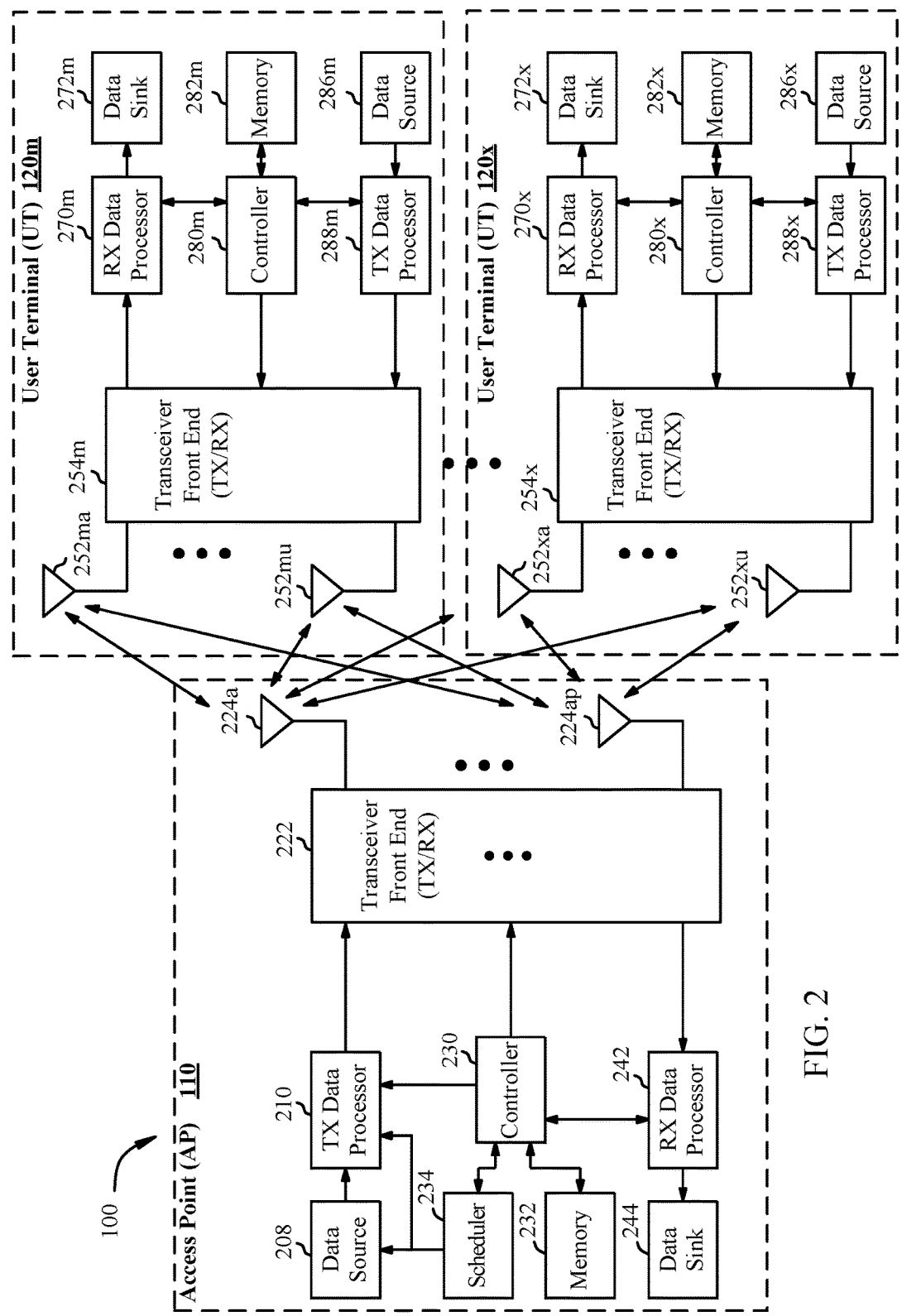
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include at least one PA as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas.

The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
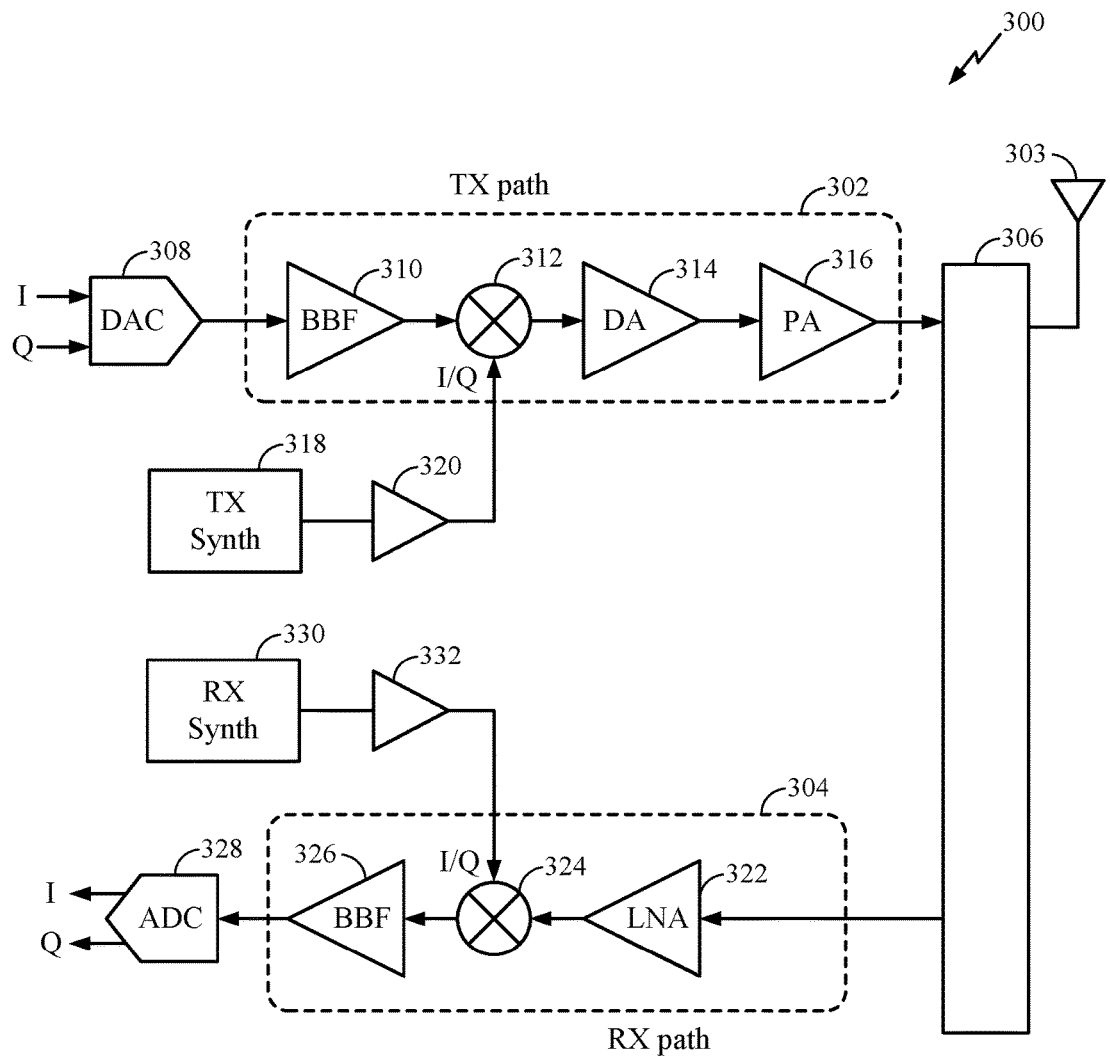
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing. In certain aspects of the present disclosure, the PA 316 may be implemented using a linearizer circuit with a low-impedance path, as described in more detail herein.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects provided herein can be applied to amplify signals in any of various other suitable systems.

Example Amplification Circuit

It may be desirable for power amplifiers (PAs) used for standards such as 5G new radio (NR) to have high linearity (e.g., 1.4% error vector magnitude (EVM)) and to support wide bandwidths (e.g., 200 MHz or 100 MHz). Class A linear PAs have good linearity and bandwidth, but may have low maximum linear power with low efficiency, especially with high peak-to-average-power ratio (PAPR) signals. A linearizer may be used to improve the soft gain compression of some PAs, but may suffer from limited bandwidth. Certain aspects of the present disclosure provide a linearizer circuit that allows for operation across a wide bandwidth.

Figure 4A:
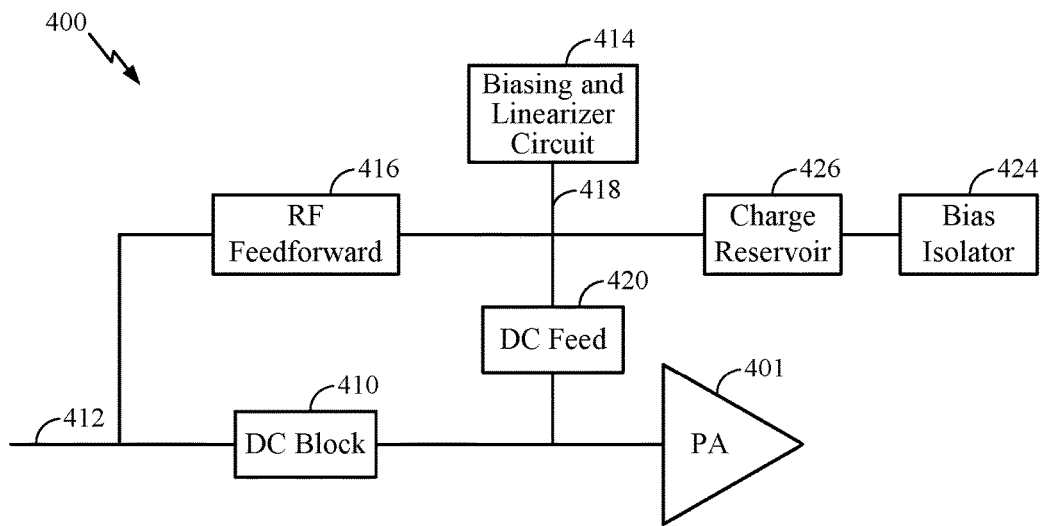
FIG. 4A is a block diagram of an example amplification circuit, in accordance with certain aspects of the present disclosure.

FIG. 4A is a block diagram of an example amplification circuit 400, in accordance with certain aspects of the present disclosure. At input node 412, an input signal is provided which is electrically coupled to an input of an amplifier 401 (e.g., PA 316) through a high-pass filter 410 (e.g., direct-current (DC) block circuit) for AC coupling of the input signal to the amplifier. The high-pass filter 410 may couple relatively high-frequency components of the input signal to the base of the transistors 402, while blocking (or at least attenuating) relatively low-frequency components (e.g., a DC component) of the signal at the input node 412. For example, the input signal may be an RF signal for amplification. The amplifier 401 is also provided a biasing current through a DC feed circuit 420 by a biasing and linearizer circuit 414. In certain aspects, the amplification circuit 400 may include a feed forward path, which may have a feedforward circuit 416 to feed a signal at the input node 412 to node 418 to improve the linearity of the amplifier 401.

In some cases, the amplification circuit 400 may suffer from a memory effect causing distortions at node 418 between the biasing and linearizer circuit 414 and the DC feed circuit 420. Certain aspects of the present disclosure are generally directed to techniques and apparatus for stabilizing the node 418 by providing a charge reservoir 426 and isolation element 424, which may be connected in series and coupled to the node 418.

Figure 4B:
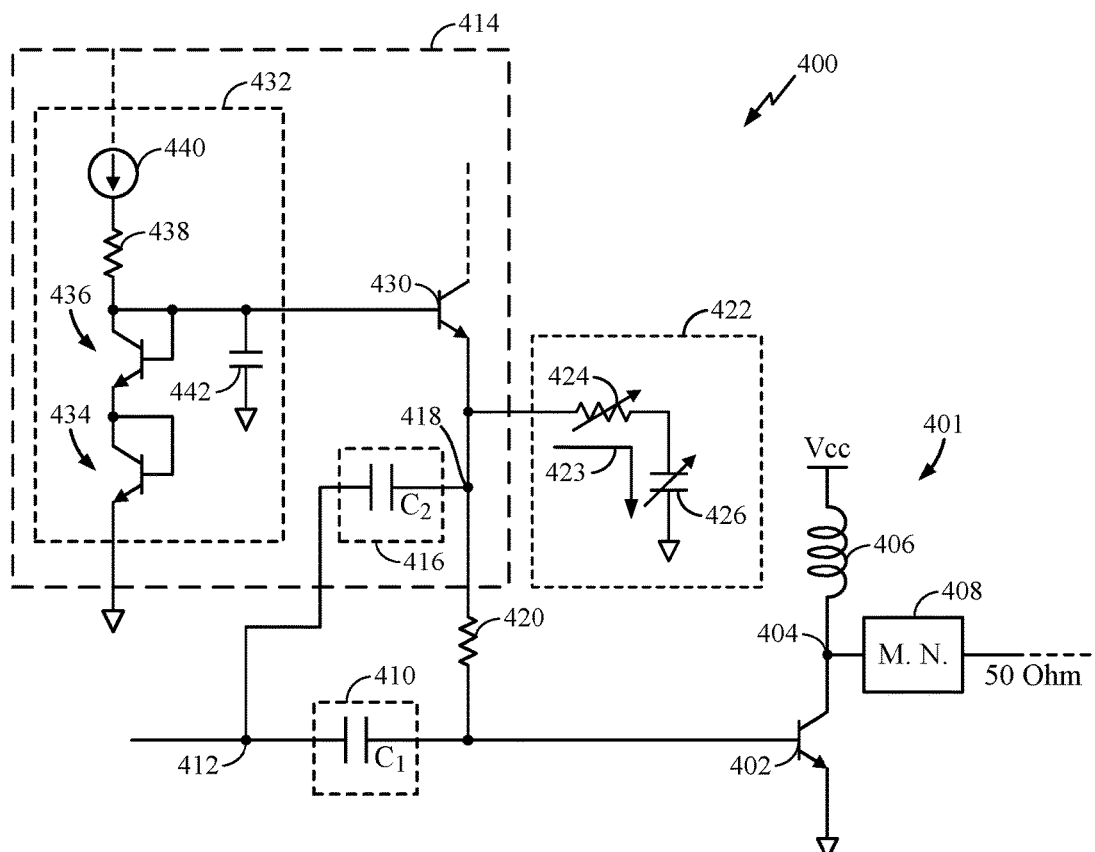
FIG. 4B illustrates an example amplification circuit implemented using a common-emitter topology, in accordance with certain aspects of the present disclosure.

FIG. 4B illustrates an example implementation of the amplification circuit 400, in accordance with certain aspects of the present disclosure. The amplification circuit 400 includes an amplifier 401 having a common-emitter topology. The amplifier 401 includes a transistor 402 (e.g., bipolar junction transistor (BJT)) coupled to an output node 404 and to a voltage rail Vcc through an inductor 406. In certain aspects, the output node 404 may be coupled to a matching network (MN) 408 for impedance matching to the characteristic impedance (e.g., $Z_0=50\Omega$) of a transmission line. The base of the transistor 402 is coupled to the input node 412 through a high-pass filter 410 (e.g., an alternating current (AC) coupling capacitor C1).

In certain aspects, the amplification circuit 400 may include a biasing and linearizer circuit 414 having a transistor 430. The emitter of transistor 430 is coupled to a node 418 (e.g., feedforward node). In certain aspects, the base of the transistor 430 may be biased using a voltage regulation circuit 432. The voltage regulation circuit 432 may be implemented using diode devices 434 and 436 (e.g., implemented as diode-connected transistors as shown), a resistive element 438, a current source 440, and a capacitive element 442. The current source 440 drives current across the resistive element 438 and forward biases the diode devices 434 and 436, such that the voltage across the capacitive element 442 is regulated to the sum of the forward voltage drops across the diode devices 434 and 436.

In some cases, the base-to-emitter voltage (Vbe) of the transistor 402 may decrease as a result of increased output power (e.g., at output node 404), increasing the non-linearity of the amplification circuit 400. Certain aspects of the present disclosure provide a dynamic biasing signal (e.g., current) for the transistor 402 to compensate for the non-linearity caused by the transistor 402. For example, the biasing and linearizer circuit 414 and the feedforward circuit 416 may provide a biasing current that increases as the input power increases (e.g., power of signal at input node 412) to compensate for the non-linearity caused by the drop in Vbe of transistor 402. In certain aspects, the feedforward circuit 416 may implemented as a high-pass filter (e.g., implemented using feedforward capacitor C2) used for coupling the signal at the input node 412 to the node 418. For example, the high-pass filter may couple relatively high-frequency components of the input signal to the node 418, while blocking (or at least attenuating) relatively low-frequency components of the signal at the input node 412. The node 418 may be coupled to the base of the transistor 402 through a DC feed circuit 420, which may be implemented using a resistive element, as illustrated. When a signal is applied to the input node 412, current is injected to node 418 through the feedforward circuit 416, dynamically increasing the bias current provided to the transistor 402.

In some cases, the amplification circuit 400 may suffer from a memory effect (e.g., due to current lag associated with the feedforward circuit 416) causing distortions at the node 418. Certain aspects of the present disclosure are generally directed to techniques for stabilizing the node 418. For example, certain aspects of the present disclosure provide a path 423 having a low-impedance at an operating frequency of the amplification circuit 400, allowing the amplification circuit 400 to operate across a wider bandwidth (e.g., 200 MHz). The path 423 may be coupled to the node 418, effectively making the node 418 into a low-impedance node at the operating frequency of the circuit.

In certain aspects, the path 423 may be implemented using an isolation element 424 and a charge reservoir 426. The charge reservoir 426 is isolated from the node 418 by the isolation element 424. For example, the isolation element 424 may be implemented using a resistive element, and the charge reservoir 426 may be implemented using a capacitive element, which may be connected in series with the resistive element. Therefore, in the example amplification circuit 400, the path 423 is implemented using a resistor-capacitor (RC) circuit 422. In certain aspects, at least one of the isolation element 424 or the charge reservoir 426 may be tunable, allowing the path 423 to be tuned to have low impedance at different frequencies depending, for example, on the input signal being amplified. The path 423 sinks current at the operating frequency of the amplifier without sinking DC current.

Certain aspects of the present disclosure provide techniques for reducing the area consumption of the charge reservoir 426. For example, in certain aspects, a charging circuit may be provided to maintain charge across the charge reservoir 426, allowing the size of the charge reservoir (e.g., capacitor) to be reduced.

Figure 5:
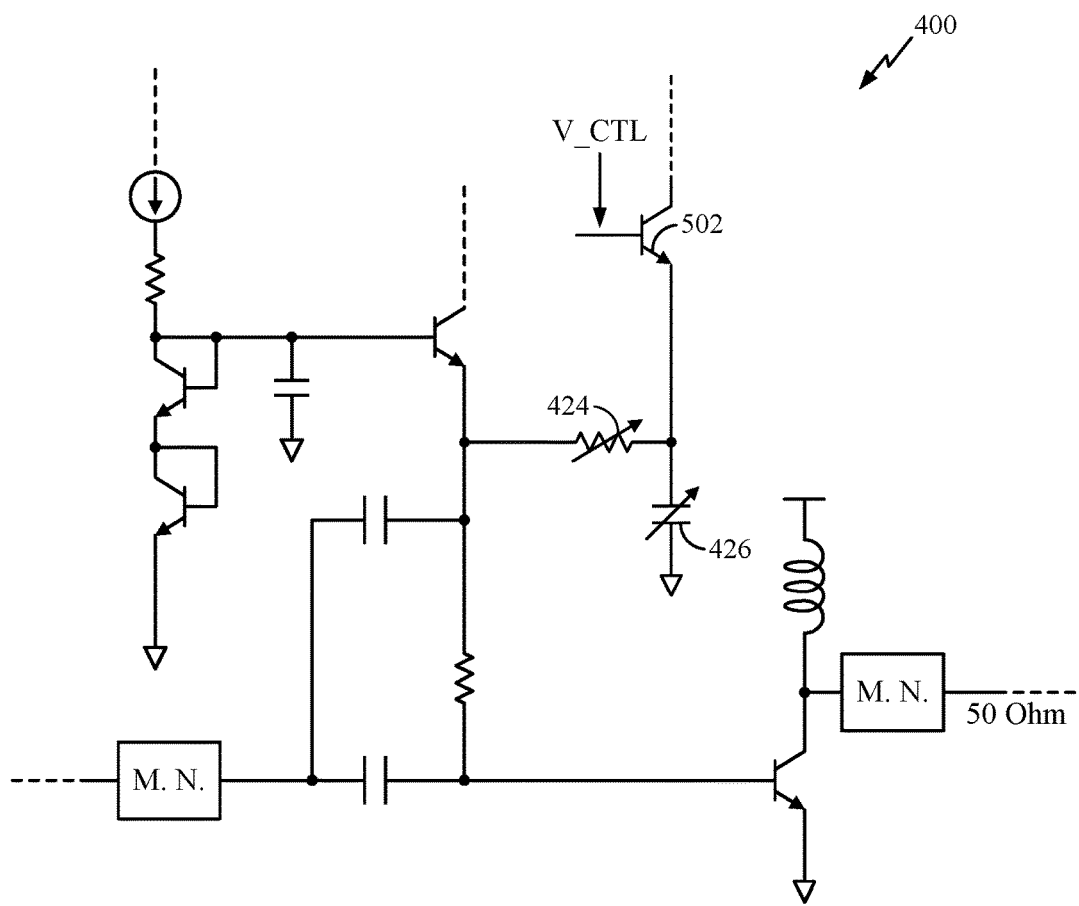
FIG. 5 illustrates an example amplification circuit having a transistor for charging a capacitive element, in accordance with certain aspects of the present disclosure.

FIG. 5 illustrates the amplification circuit 400 having a transistor 502 for charging the charge reservoir 426, in accordance with certain aspects of the present disclosure. For example, the transistor 502 may have an emitter coupled to the charge reservoir 426 and a base that is biased using a control voltage (V_CTL). In certain aspects, the control voltage V_CTL may be the same as a voltage at the base of transistor 430. In some cases, the control voltage V_CTL may be dynamically controlled. For example, the control voltage V_CTL may be adjusted based on variations caused by process, voltage, and temperature (PVT). The transistor 502 provides a charging current to maintain charge across the charge reservoir 426, and thus, the charge reservoir 426 can be implemented using a smaller capacitor.

Figure 6:
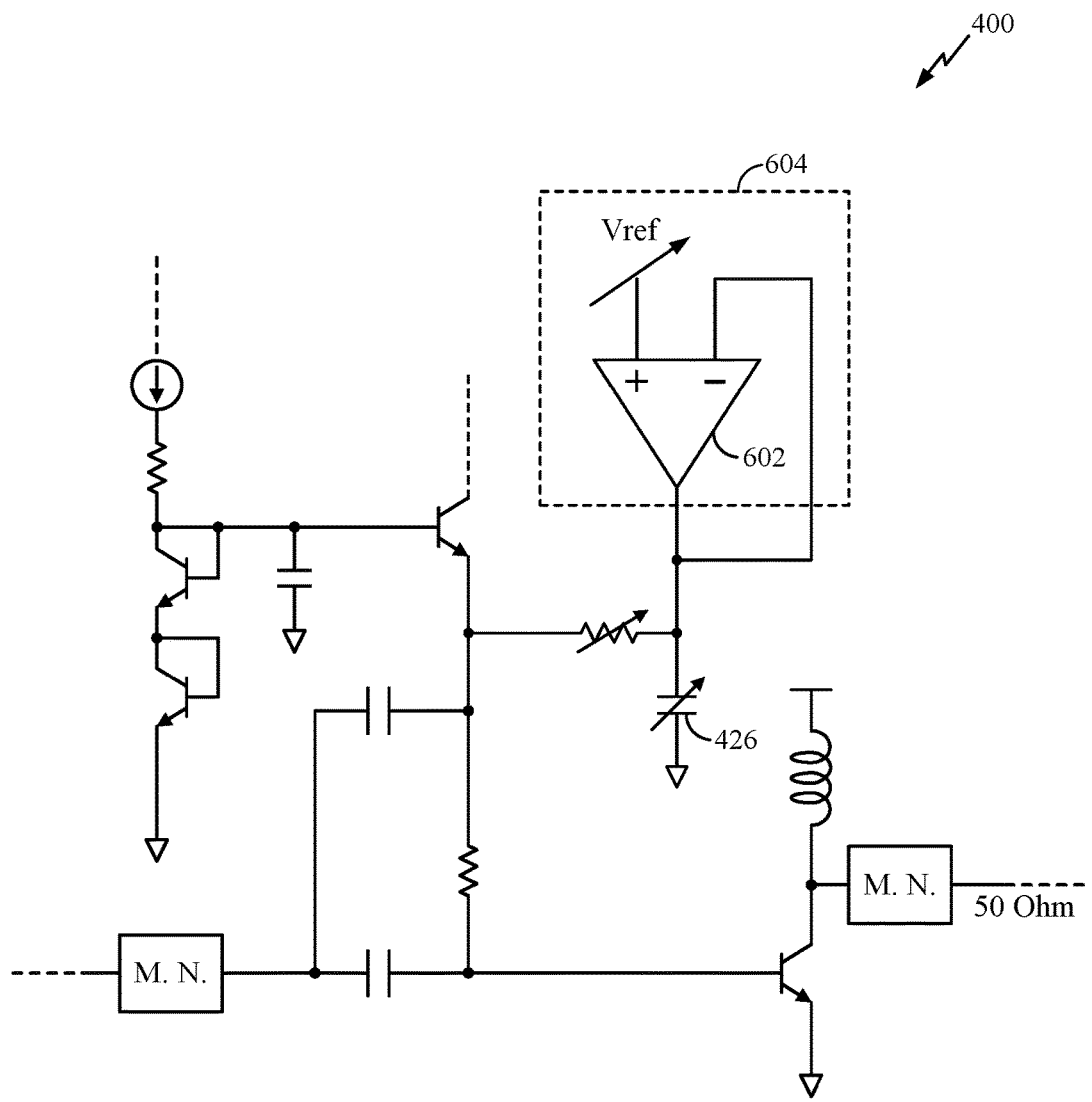
FIG. 6 illustrates an example amplification circuit having a buffer circuit for charging a capacitive element, in accordance with certain aspects of the present disclosure.

FIG. 6 illustrates the amplification circuit 400 having a buffer circuit 604 for charging the charge reservoir 426, in accordance with certain aspects of the present disclosure. The buffer circuit 604 may be implemented using an amplifier 602. For example, the amplifier 602 may be implemented as a unity gain amplifier by coupling a negative input terminal of the amplifier 602 to the output of the amplifier 602, and driving the positive input terminal of the amplifier 602 with a reference voltage (Vref). In certain aspects, the reference voltage Vref may be dynamically controlled. For example, the reference voltage Vref may be adjusted based on variations caused by process, voltage, and temperature (PVT). The buffer circuit 604 provides a charging current to maintain charge across the charge reservoir 426, thereby allowing the charge reservoir 426 to be implemented using a smaller capacitor.

Figure 7:
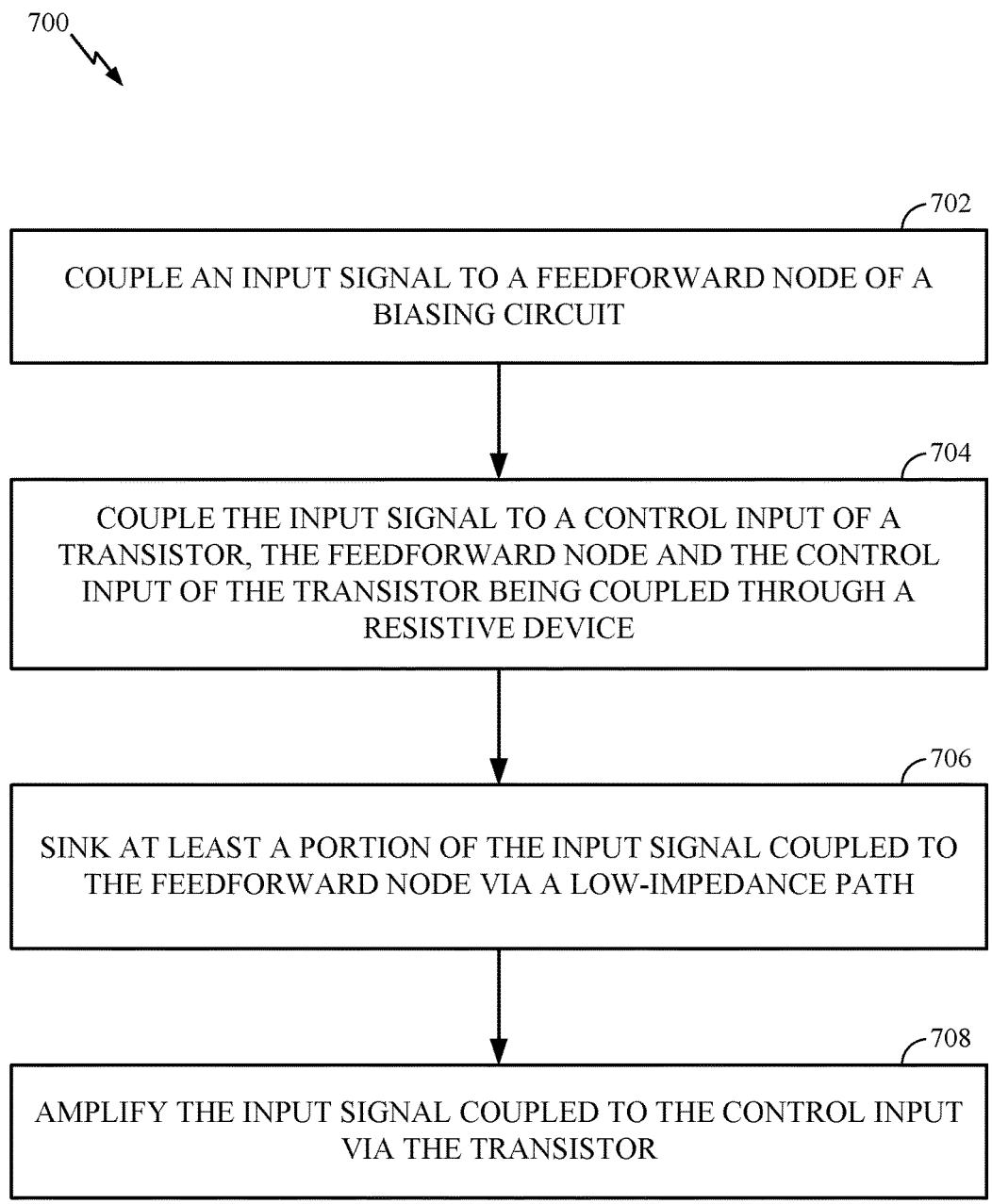
FIG. 7 is a flow diagram illustrating example operations for signal amplification, in accordance with certain aspects of the present disclosure.

FIG. 7 is a flow diagram illustrating example operations 700 for signal amplification, in accordance with certain aspects of the present disclosure. The operations 700 may be performed by a circuit, such as the example amplification circuit 400 of FIGS. 4A-6.

The operations 700 may begin, at block 702, by coupling an input signal to a feedforward node (e.g., node 418) of a biasing circuit (e.g., biasing and linearizer circuit 414). As used herein, the term "coupling" when applied to a signal generally refers to electrically directing (e.g., via routing or steering) at least a portion of the signal, and not to mechanically connecting or otherwise coupling traces, leads, wires, and/or other conductors together. At block 704, the operations 700 continue by coupling the input signal to a control input (e.g., base) of a transistor (e.g., transistor 402), the feedforward node and the control input of the transistor being coupled through a resistive element (e.g., DC feed circuit 420). At block 706, at least a portion of the input signal coupled to the feedforward node is sunk via a low-impedance path (e.g., path 423), and at block 708, the input signal coupled to the control input is amplified via the transistor.

In certain aspects, coupling the input signal to the feedforward node may include coupling a first high-frequency component of the input signal to the feedforward node. In some cases, coupling the input signal to the control input of the transistor may include coupling a second high-frequency component of the input signal to the control input of the transistor.

In certain aspects, the low-impedance path comprises an isolation element (e.g., isolation element 424) coupled to a charge reservoir (e.g., charge reservoir 426). In this case, the operations 700 also include sourcing current to the charge reservoir to sink at least a portion of the first high-frequency component. In certain aspects, the biasing circuit may include a second transistor (e.g., transistor 430). In this case, the operations 700 also include regulating a voltage at a control input (e.g., base) of the second transistor.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. For example, means for coupling may comprise, for example, a high-pass filter, such as the feedforward circuit 416 or high-pass filter 410 of FIG. 4B, or a device for AC coupling, such as a capacitor or other capacitive element. Means for amplifying may comprise, for example, a transistor such as the transistor 402 of FIG. 4B. Means for sinking may comprise, for example, an RC circuit such as the RC circuit 422 of FIG. 4B.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An amplification circuit comprising:
   a first transistor;
   an input path coupled between an input node of the amplification circuit and a control input of the first transistor;
   a feedforward path coupled between the input node and a feedforward node;
   a first resistive device coupled between the feedforward node and the control input of the first transistor;
   a biasing circuit coupled to the feedforward node;
   a low-impedance path including a variable resistor and a variable capacitor coupled to the feedforward node.

2. The amplification circuit of claim 1, wherein:
   the input path comprises a first capacitive element coupled between the input node of the amplification circuit and the control input of the first transistor; and
   the feedforward path comprises a second capacitive element coupled between the input node and the feedforward node.

3. The amplification circuit of claim 1, wherein the first transistor is configured as a common-emitter amplifier, and wherein the control input comprises a base of the first transistor.

4. The amplification circuit of claim 1, further comprising:
   a current source circuit coupled to a node between the isolation element and the charge reservoir.

5. The amplification circuit of claim 4, wherein the current source circuit comprises an operational amplifier having a first input coupled to a reference voltage node and a second input coupled to an output of the operational amplifier, the output of the operational amplifier being coupled to the node between the variable resistor and the variable capacitor.

6. The amplification circuit of claim 4, wherein the current source circuit comprises a second transistor having a control input coupled to a reference voltage node.

7. The amplification circuit of claim 6, wherein the second transistor comprises an emitter coupled to the node between the variable resistor and the variable capacitor, and wherein the control input of the second transistor comprises a base of the second transistor.

8. The amplification circuit of claim 1, wherein the biasing circuit comprises a second transistor coupled to the feedforward node.

9. The amplification circuit of claim 8, wherein a control input of the second transistor is coupled to a voltage regulation circuit.

10. The amplification circuit of claim 9, wherein the voltage regulation circuit comprises:
    a first diode device and a second diode device, a control input of the second transistor being coupled to an anode of the first diode device, the first diode device having a cathode coupled to an anode of the second diode device, and the second diode device having a cathode coupled to a reference potential node;
    a current source; and
    a second resistive device coupled between the control input of the second transistor and the current source.

11. The amplification circuit of claim 10, wherein the first transistor comprises an emitter coupled to the reference potential node and wherein the control input comprises a base of the first transistor.

12. The amplification circuit of claim 10, wherein at least one of the first diode device or the second diode device comprises a diode-connected transistor.

13. A method for signal amplification, comprising:
coupling a first high-frequency component of an input signal to a feedforward node of a biasing circuit;
coupling a second high-frequency component of the input signal to a control input of a transistor, the feedforward node and the control input of the transistor being coupled through a resistive element;
sinking at least a portion of the input signal coupled to the feedforward node via a low-impedance path and wherein the low impedance path including a variable resistor and a variable capacitor; and
amplifying the input signal coupled to the control input via the transistor.

14. The method of claim 13, wherein the transistor is configured as a common-emitter amplifier, and wherein the control input comprises a base of the transistor.

15. The method of claim 13, wherein the biasing circuit comprises a second transistor, the method further comprising:
regulating a voltage at a control input of the second transistor.

16. An apparatus for signal amplification, comprising:
means for coupling a first high-frequency component of an input signal to a feedforward node of a biasing circuit;
means for coupling a second high-frequency component of the input signal to an amplification node;
means for amplifying the input signal coupled to the amplification node; and
means for sinking at least a portion of the input signal coupled to the feedforward node, the means for sinking having a low-impedance path and wherein the low impedance path including a variable resistor and a variable capacitor.

* * * * *